(12) United States Patent
Luo et al.

(10) Patent No.: US 6,582,522 B2
(45) Date of Patent: Jun. 24, 2003

(54) EMISSIVITY-CHANGE-FREE PUMPING PLATE KIT IN A SINGLE WAFER CHAMBER

(75) Inventors: Lee Luo, Fremont, CA (US); Henry Ho, San Jose, CA (US); Shulin Wang, Campbell, CA (US); Binh Hoa Tran, San Jose, CA (US); Alexander Tam, Union City, CA (US); Errol A. C. Sanchez, Dublin, CA (US); Xianzhi Tao, Palo Alto, CA (US); Steven A. Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/798,424

(22) Filed: Mar. 2, 2001

(65) Prior Publication Data

US 2002/0137312 A1 Sep. 26, 2002

Related U.S. Application Data

(60) Provisional application No. 60/220,039, filed on Jul. 21, 2000, now abandoned.

(51) Int. Cl.[7] .............................................. C23C 16/00
(52) U.S. Cl. .................. 118/715; 118/725; 156/345.29
(58) Field of Search ............................. 118/715, 725; 156/345.29

(56) References Cited

U.S. PATENT DOCUMENTS 5,558,717 A * 9/1996 Zhao et al. .................. 118/715
5,582,866 A * 12/1996 White ......................... 118/715
5,846,332 A * 12/1998 Zhao et al. .................. 118/728
5,895,530 A   4/1999 Shrotriya et al.
5,963,840 A * 10/1999 Xia et al. ..................... 438/743
6,063,198 A *  5/2000 Bang et al. .................. 118/692
6,153,261 A * 11/2000 Xia et al. ................. 427/255.29
6,165,271 A * 12/2000 Zhao et al. .................. 118/715
6,261,408 B1 *  7/2001 Schneider et al. ........... 118/715
6,319,324 B1 * 11/2001 Nguyen et al. .............. 118/697
6,395,092 B1 *  5/2002 Sugiarto et al. ............. 118/695
6,423,949 B1 *  7/2002 Chen et al. ............... 219/444.1

FOREIGN PATENT DOCUMENTS

EP         0909836 A2     4/1999
WO    WO 02/08489 A3  *  1/2002

OTHER PUBLICATIONS

PCT Search Report, Feb. 19, 2002, 7 pages.

* cited by examiner

Primary Examiner—Jeffrie R. Lund
(74) Attorney, Agent, or Firm—Blakely Sokoloff Taylor & Zafman

(57) ABSTRACT

Provided herein is an emissivity-change-free pumping plate kit used in a single wafer chamber. This kit comprises a top open pumping plate, and optionally a skirt and/or a second stage choking plate. The skirt may be installed around the wafer heater, underneath the wafer heater, or along the chamber body inside the chamber. The choking plate is installed downstream of the top open pumping plate along the purge gas flow. Also provided is a method of preventing emissivity change and further providing optimal film thickness uniformity during wafer processing by utilizing such kit in the chamber.

13 Claims, 7 Drawing Sheets

| MEAN | 1138.6 | | WAFER DIAM | 200.00 |
| --- | --- | --- | --- | --- |
| STD DEV | 15.597 | 1.370% | TEST DIAM | 194.00 |
| MINIMUM | 1111.1 | | TEMPLATE MAP | 49 SITE |
| MAXIMUM | 1172.4 | | CONTOUR DISP | STD |
| # SITES/GOOD | 49/49 | | INTERVAL | 1.000 |
| | | | | |
| SUBSTRATE | 50MM (275 μ) Si | | LAYER 2 FILM | POLY Si |
| SORTING SIGMA | 3.0 | | MEAN-TARGET | 0.000 |
| CORRELATION | * NONE | | WARNING | 0.000 |
| UNITS | ANGSTROMS | | SPEC | 0.000 |

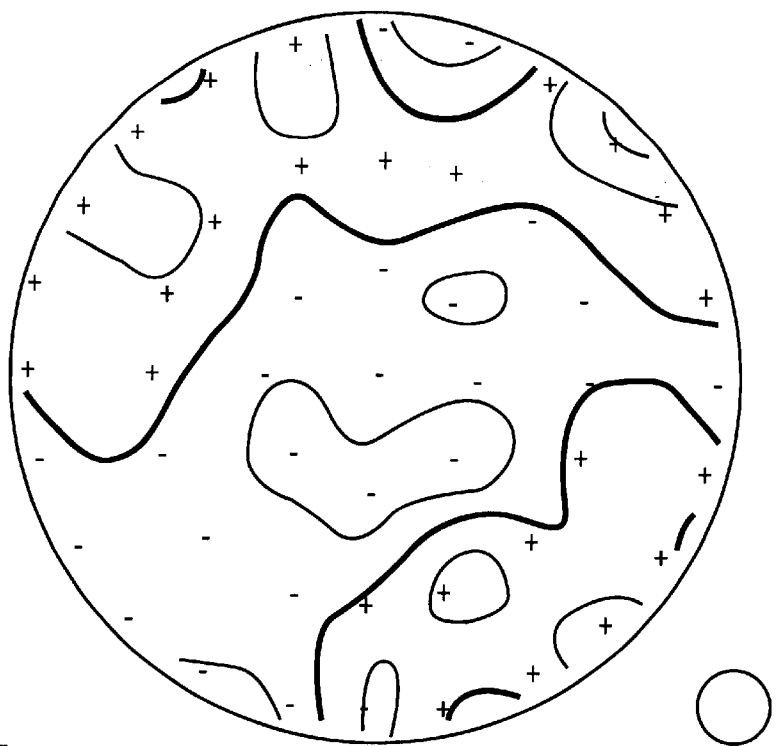

- GOF Error
- ▲ Sigma Error
- ■ Measurement Error
- − Below Calculated Mean
- + Above Calculated Mean

| | | | |
|---|---|---|---|
| Wafer Diameter | 200 mm | Limits: | Percent |
| Edge Exclusion | 3.000 mm | Mean Target | 0.00 Å |
| Type/Pattern | Polar/49 Site Map | U/L Control | 20.0%/20.0% |
| # Sites/Good | 49/49 | U/L Warning | 5.0%/5.0% |
| Measurement | 2nd Thickness | U/L Sigma | 3.00/3.00 |
| Mean | 1318.29 Å | Stdv Control | 1.000 |
| Std. Deviation | 10.5104 Å / 0.797% | Contour Display | Percent |
| Minimum | 1300.49 Å | Interval | 11.0962 |
| Maximum | 1341.45 Å | | |
| Range | 40.95 | Film Stack | Ox/aSi/Ox-T, T&n&k, TCopy |
| | | Layer 3 | Thermal SiO2 |
| | | Layer 2 | # Amorphous Si |
| | | Layer 1 | Thermal SiO2 |
| | | Substrate | Silicon |

FIG. 3

EMISSIVITY-CHANGE-FREE PUMPING PLATE KIT IN A SINGLE WAFER CHAMBER

CROSS-REFERENCE TO RELATED APPLICATION

This non-provisional patent application claims benefit of provisional patent application U.S. Ser. No. 60/220,039, filed Jul. 21, 2000, now abandoned.

BACKGROUND OF THE INVENTION

1. Field of the Invention

The present invention relates generally to the field of semiconductor manufacturing. More specifically, the present invention relates to an emissivity-change-free pumping plate kit in a single wafer chamber.

2. Description of the Related Art

Chemical vapor deposition, commonly referred to as "CVD" is one of a number of processes used to deposit thin layers of material on a semiconductor wafer, and may be based on thermal, plasma, or optically assisted decomposition, or reaction of chemicals. To process wafers in, for example, a thermal CVD process, a chamber is provided with a susceptor configured to receive a wafer. The wafer is typically placed onto and removed from the susceptor by a robot blade and supported by the susceptor during processing. In these typical prior art systems, the susceptor and the wafer are heated to a temperature of between 200–650° C. prior to processing. Once the wafer is heated to an appropriate temperature, a processing fluid, typically a gas, is introduced into the chamber through a gas manifold often situated above the wafer. The processing gas thermally decomposes upon contact with the heated wafer surface to deposit a thin material layer thereon.

A primary goal of wafer processing is to obtain as many useful dies as possible from each wafer. Many factors affect the ultimate yield of die from each wafer processed. These factors include processing variables, which affect the uniformity and thickness of the material layer deposited on the wafer, and particulate contaminants that can attach to a wafer and contaminate one or more die. Both of these factors must be controlled in CVD and other processes to maximize the die yield from each wafer.

During the deposition, yellow or black powders tend to accumulate inside the chamber (e.g., on the pumping and face plates), which would cause emissivity change in the chamber and further temperature change. After processing certain number of wafers, emissivity change would render the process inconsistent from one wafer to another. Therefore, the prior art is deficient in the lack of effective means or process system that would prevent emissivity change, thereby improve the uniformity of process. Additionally, the prior art is deficient in the lack of an effective means of providing a uniform thermal boundary condition around the wafer heater so as to enhance optimal film thickness uniformity. The present invention fulfills these long-standing needs and desires in the art.

SUMMARY OF THE INVENTION

Provided herein in one aspect of the present invention is an emissivity-change-free pumping plate kit used in a single wafer chamber. This kit comprises a top open pumping plate, wherein there is no restriction to the flow. This kit may further comprise a skirt and/or a second stage choking plate. The skirt may be installed around the wafer heater, underneath the wafer heater, or along the chamber body inside the chamber, while the choking plate is installed downstream of the top open pumping plate along the purge gas flow.

The emissivity-change-free pumping plate kit disclosed herein may be used for preventing emissivity change during wafer processing by providing, in part, a gas purge to the chamber to prevent residual or powder formation on the pumping and face plates, thereby preventing an emissivity change in the chamber. More specifically, the gas purge may flow from the bottom purge or from the showerhead. Furthermore, even with a gas purge, powder formation may occur. Therefore, to reduce powder formation on the pumping and face plates, minimization of exposure to the gas is desirable, i.e., one can facilitate gas exiting between the pumping plate and face plate by using this top open pumping plate kit. The kit may also be used for providing optimal film thickness uniformity during wafer processing.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIG. 3 shows that with a top open pumping plate, the thickness uniformity is 0.79%. It is indicated that opening the pumping plate improves the uniformity.

DETAILED DESCRIPTION OF THE INVENTION

Disclosed herein is an emissivity-change-free pumping plate kit used for preventing the emissivity change during wafer processing which leads to process drift and particles. Problems such as powder formation in the inner chamber and blockage of pumping holes by powder are also addressed herein.

Figure 2:
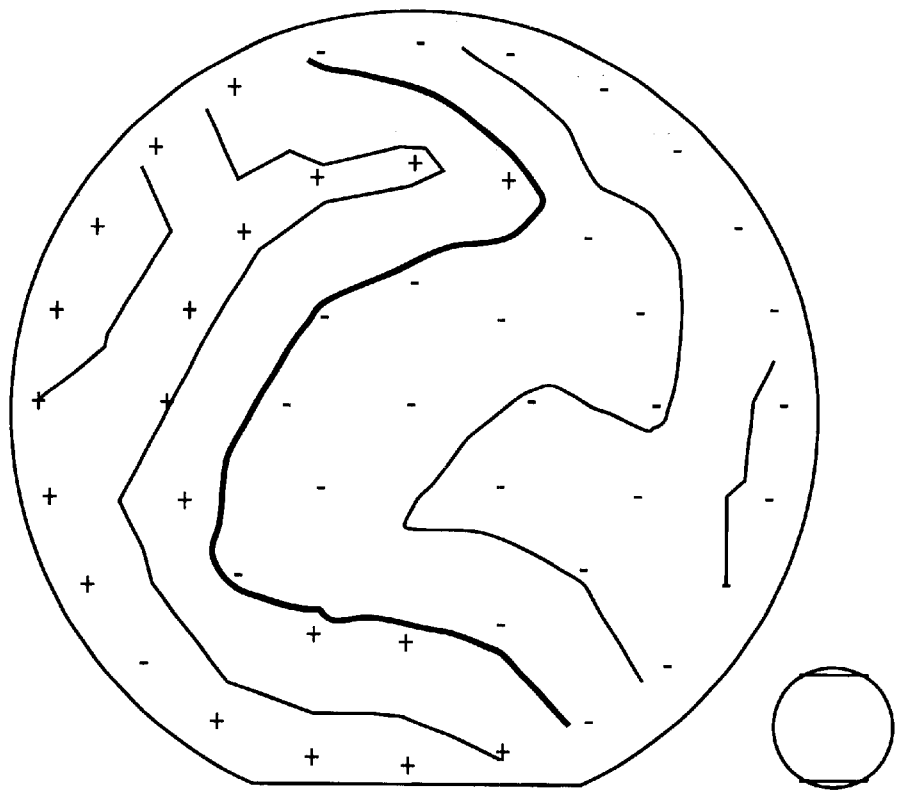
FIG. 2 shows that the uniformity is 1.37% using a standard pumping plate. This standard pumping plate of the prior-art does not have a top opening but holes. During the pumping, the purge gas goes through the holes.
Figure 5:
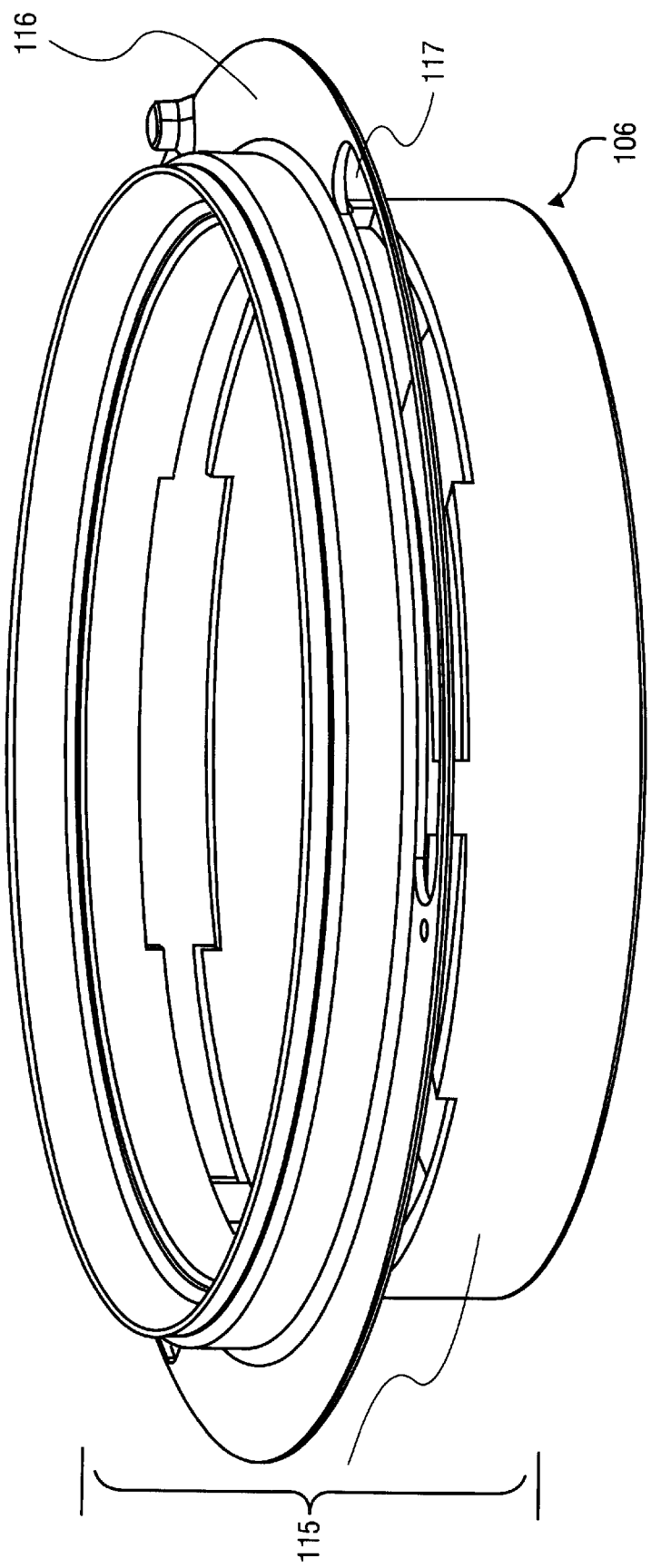
FIG. 5 is a 3-dimensional view of the top open pumping plate 106.

In the prior art for silicon (Si) deposition, a standard pumping plate is used, which has pumping holes for gas to flow through. FIG. 2 shows that with the standard pumping plate, the uniformity is 1.37%. During the deposition, yellow or black powders tend to accumulate on the pumping and face plates, which would cause emissivity change in the chamber and further temperature change. In order to improve the uniformity and meanwhile prevent emissivity change, a top open pumping plate is used in the present invention (see FIG. 5). With the top of the pumping plate fully open, purge gas can easily flow into the pumping channel and further eliminate the powder from the chamber. FIG. 3 shows that with a top open pumping plate, the thickness uniformity is 0.79%. It is indicated that opening the pumping plate improves the uniformity.

Additionally, during the deposition, the wafer heater tends to interact with the chamber body, which causes heat loss. In order to reduce the heat loss thereby improve the reliability and lifetime of the heater, a skirt is installed around the heater, underneath the heater, or along the chamber body inside the chamber. The skirt prevents the heater from interacting with the chamber body directly and makes the process condition more consistent from one chamber to another, therefore provides the same thermal boundary condition around the wafer heater and leads to optimal film thickness uniformity.

Figure 4:
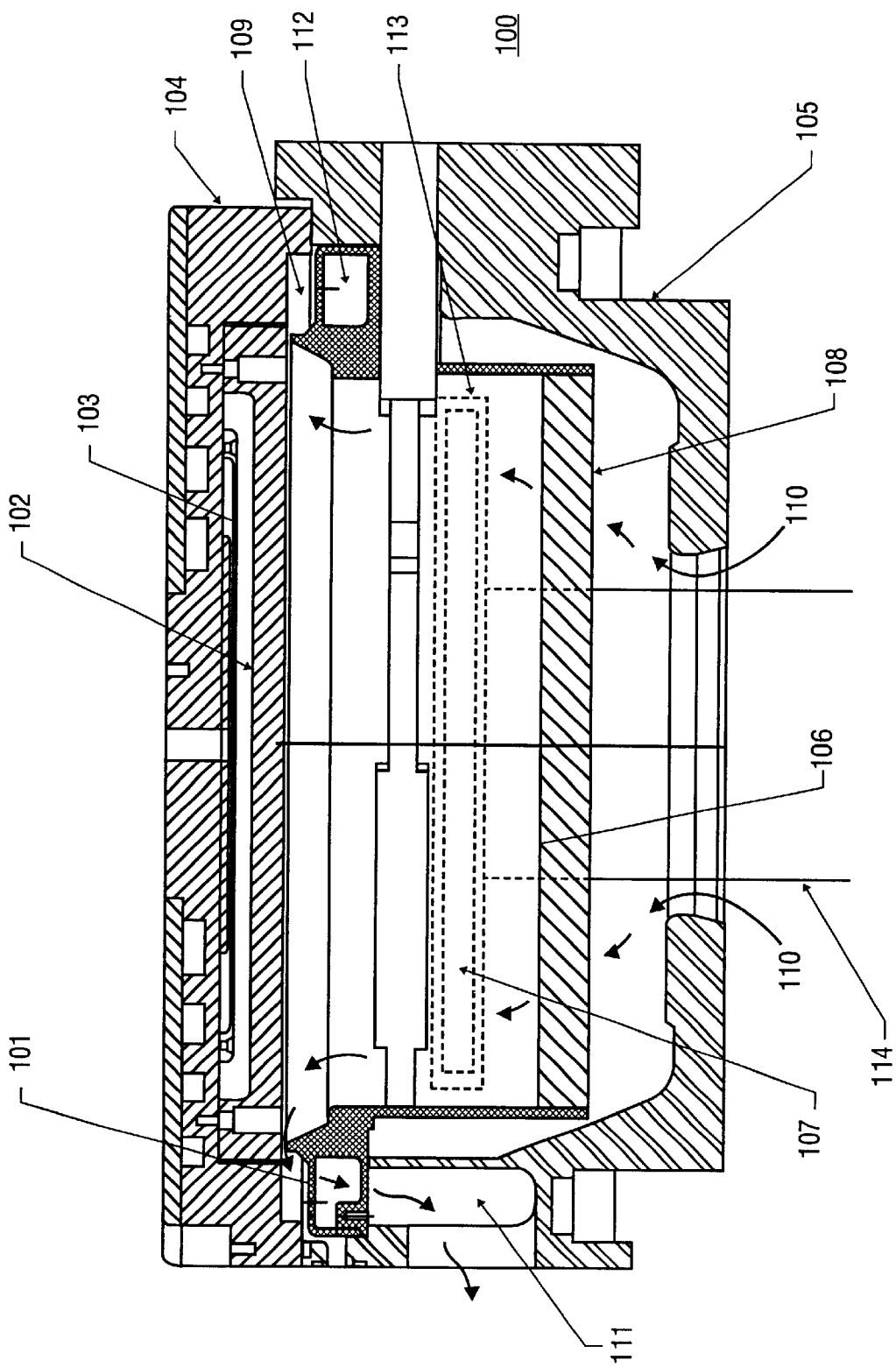
FIG. 4 is a cross-sectional view of POLYGen chamber 100, comprising pumping plate channel ring 101, face plate 102, blocker plate 103, chamber lid 104, chamber body 105, and pumping plate with top open 106. The pumping plate channel ring serves as a second stage choking plate. The purge gas enters the pumping plate from the bottom or the top of the chamber. With the top open, the gas flows freely out of the chamber.
Figure 6:
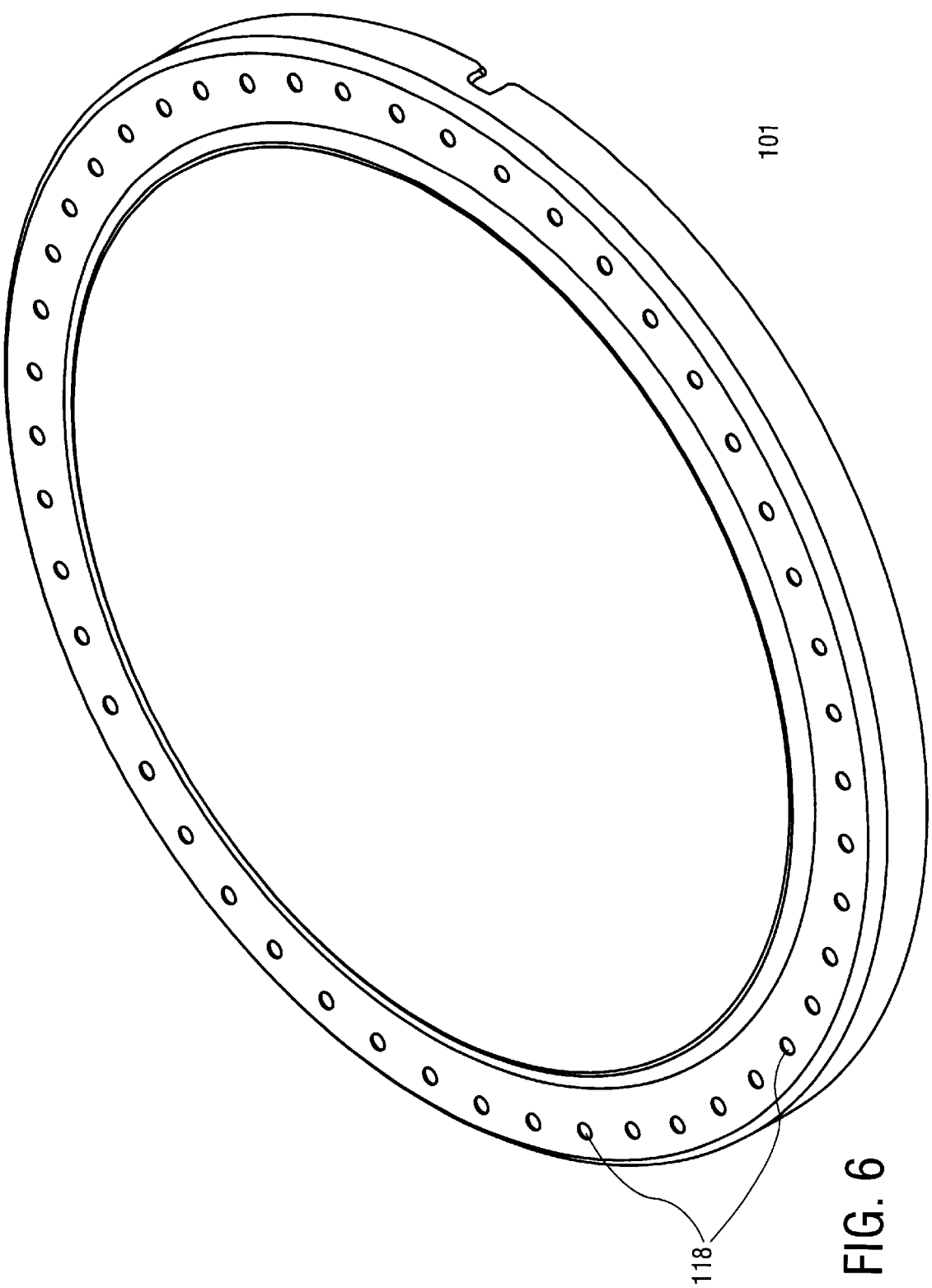
FIG. 6 is a 3-dimensional view of a uniform choking plate, wherein the holes are evenly spaced 101.

Another problem with the prior-art methodology for depositing silicon is that due to high deposition temperature, the chamber is constantly under high pressure, which makes it hard to control the exit gas flow uniformity. To solve this problem, a second pumping plate with reduced opening is hereby utilized in the present invention, which is installed downstream of the top open pumping plate along the purge gas flow (see pumping plate channel ring in FIG. 4). This second pumping plate provides choking effect for uniform exit gas pumping to ensure optimal thickness uniformity on the wafer. The choking plate can be uniform (see FIG. 6) or non-uniform. Uniform choking plate has evenly spaced holes, while non-uniform plate has more holes in one area and fewer in others.

As a specific example, a process chamber incorporating the above-described emissivity-change-free pumping plate kit is disclosed in one aspect of the present invention. The chamber is called POLYGen chamber 100, comprising a chamber body 105, a chamber lid 104, a top open pumping plate 106, pumping plate channel ring(s) 101 (i.e., second stage choking plate), a face plate 102, and a blocker plate 103 (see FIG. 4). A skirt (not shown) may be installed around the wafer heater (not shown), underneath the wafer heater, or along the chamber body 105 inside the chamber 100 and underneath the pumping plate 106. The emissivity-change-free pumping plate kit allows for two-stage pumping: at the first stage, the top open pumping plate 106 makes the pumping process freer and quicker as compared to a standard pumping plate. With purge gas being flown into the top open pumping plate 106 from the bottom of the chamber 100, powder formation is reduced on the pumping plate 106 and on the face plate 102. At the second stage, a choking effect is provided for uniform exit gas pumping to ensure optimal thickness uniformity on the wafer via a second pumping plate, which has reduced openings on the top. Standard purge gas may be used, such as $N_2$, Ar, and He.

In addition, the pumping channel designed provides a larger area for trapping the powders which thus significantly reduces the possibility of blocking the pumping holes by powders. Furthermore, the emissivity-change-free pumping plate kit provides a uniform thermal boundary condition around the wafer heater (especially with the skirt), thus making the condition between the heater and the surrounding area consistent. This leads to optimal film thickness uniformity.

Figure 7:
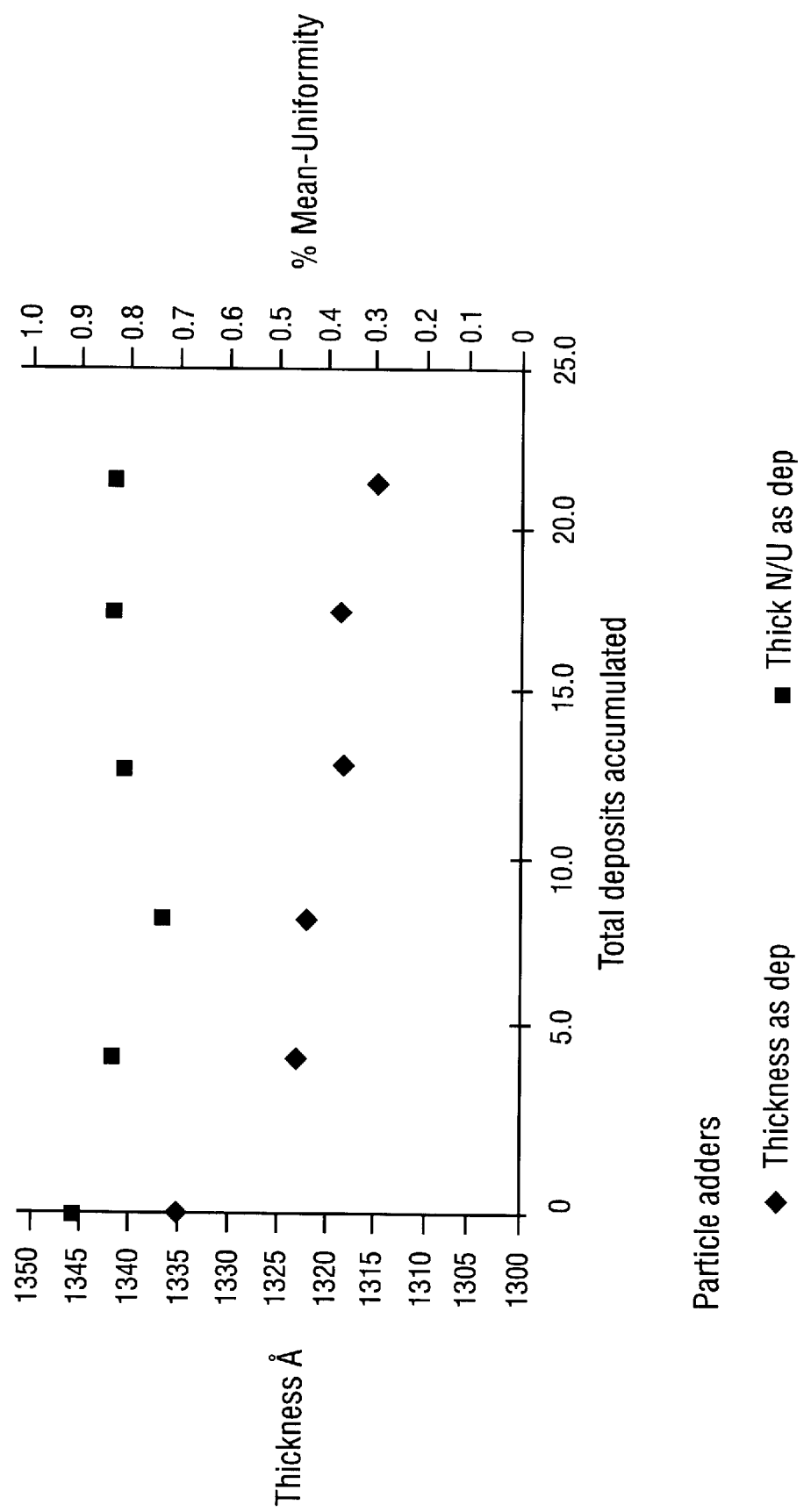
FIG. 7 is a plot of the data contained in Table 1, illustrating that the uniformity and thickness stayed the same as the total deposition of silicon approached 21 $\mu$m using the presently disclosed pumping plate kit during wafer processing.

Table 1 shows the test results from an emissivity change free pumping plate with top open and second stage choking plate. The smaller is the percentage of uniformity of thickness, the better is the uniformity (0=completely uniform). FIG. 7 is a plot of the data contained in Table 1.

TABLE 1

Test Results from Pumping Plate (top open with second stage choke)

| Si Dep. Th. ($\mu$m) | Th. (Å) | U. of Th. (%) |
| --- | --- | --- |
| 0 | 1335 | 0.935 |
| 3.5 | 1323 | 0.840 |
| 8.0 | 1322 | 0.713 |
| 12.6 | 1318 | 0.776 |
| 17.1 | 1318 | 0.797 |
| 21.6 | 1314 | 0.788 |

Abbreviations: Dep.—deposition; U.—uniformity; Th.—thickness

Figure 1:
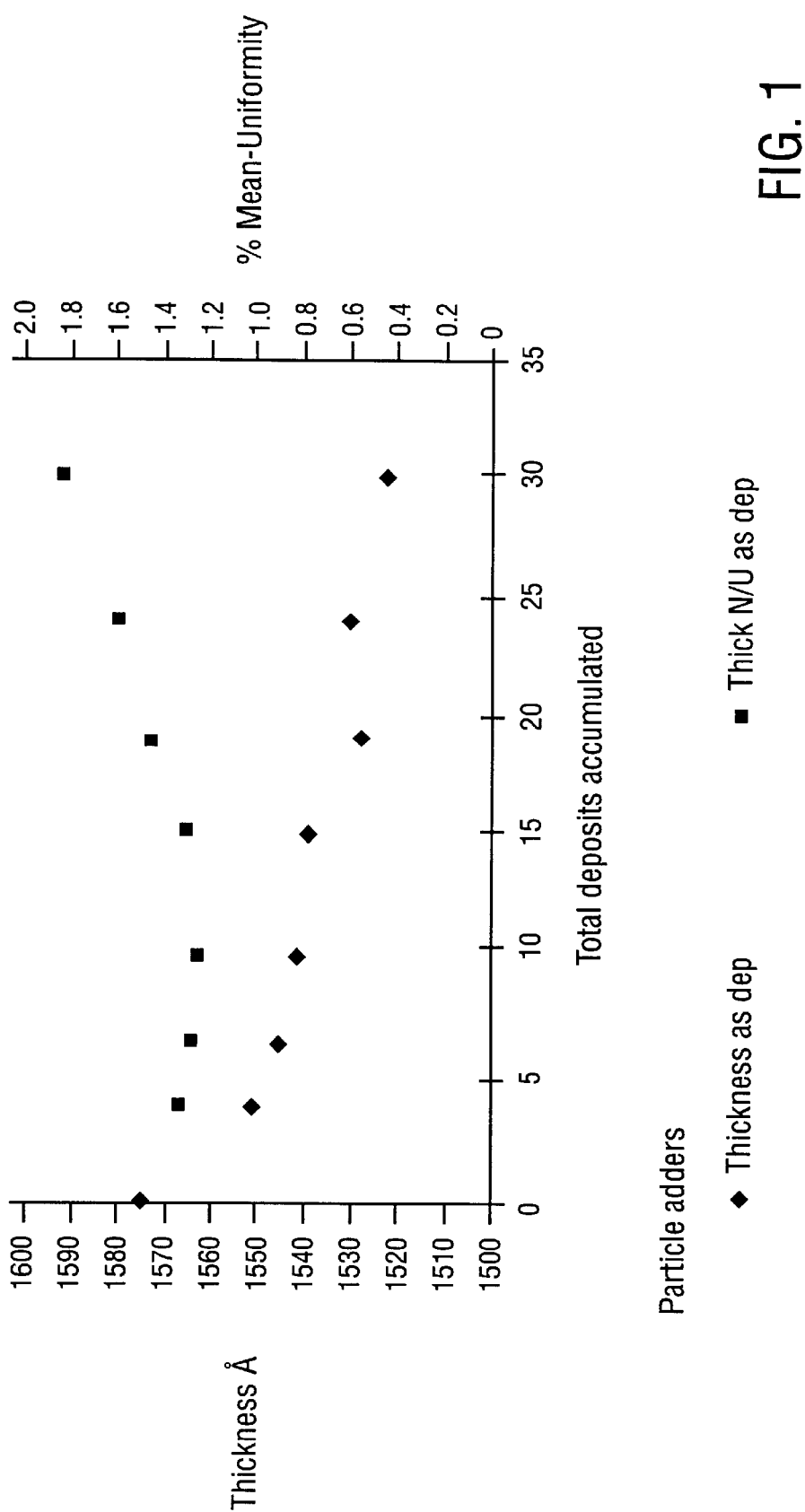
FIG. 1 shows 30 micron doped poly cycling using a standard pumping plate illustrating that cleaning was postponed until about 10 microns.

This shows that as the total deposition of silicon (Si) approached 21 $\mu$m, the uniformity and the thickness stayed the same. Using the presently disclosed pumping plate kit during wafer processing, the productivity is significantly improved for a P-doped polysilicon process from 5 $\mu$m total deposition per chamber dry clean (90 min each time for chamber clean) to more than 25 $\mu$m of total deposition per chamber clean (see FIGS. 1 and 7 for comparison). With reduced frequency of cleaning, the system throughput is increased. The pumping plate kit disclosed herein prevents the emissivity change which leads to process drift. When there is no process drift, cleaning is not necessary.

As described above, provided herein in one aspect of the present invention is an emissivity-change-free pumping plate kit used in a single wafer chamber. This kit comprises a top open pumping plate, wherein there is no restriction to the flow. This kit may further comprise a skirt and/or a second stage choking plate. The skirt may be installed around the wafer heater, underneath the wafer heater, or along the chamber body inside the chamber, while the choking plate is installed downstream of the top open pumping plate along the purge gas flow. The choking plate may have uniform or non-uniform holes.

The emissivity-change-free pumping plate kit disclosed herein may be used for preventing an emissivity change during wafer processing by providing a gas purge to the chamber so as to prevent residual or powder formation on the pumping and face plates, thereby preventing an emissivity change in the chamber. The kit may also be used for providing optimal film thickness uniformity during wafer processing, wherein uniform exit gas pumping is provided, thereby a uniform thermal boundary condition is provided around the wafer heater which leads to optimal film thickness uniformity.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. An apparatus for fabricating an integrated circuit device comprising:
   an enclosure housing a processing chamber, said processing chamber having an inner wall;
   a processing chamber lid;
   a pumping plate for said processing chamber comprising a cylindrical body member having an outer wall, a top edge defining an open top, a bottom edge, and a ledge protruding from said outer wall, said ledge having an upper surface and a lower surface;
   a first pumping channel defined by said outer wall of said pumping plate, said upper surface of said ledge, said inner wall of said processing chamber, and said chamber lid; and
   a second pumping channel defined by said outer wall of said pumping plate, said lower surface of said ledge, and said inner wall of said processing chamber.

2. The apparatus of claim 1, wherein there is no restriction to gas flow out of said pumping plate and into said first pumping channel.

3. The apparatus of claim 1, wherein said pumping plate prevents emissivity change in said chamber.

4. The apparatus of claim 1 further comprising:
   a susceptor disposed within the processing chamber for supporting a wafer thereon; and,
   a wafer heater within said susceptor.

5. The apparatus of claim 4, wherein said pumping plate is installed around said wafer and said pumping plate extends above said wafer.

6. The apparatus of claim 4, further comprising:
   a skirt extending from said bottom edge of said cylindrical body member.

7. The apparatus of claim 4, wherein said skirt provides a uniform thermal environment to said wafer.

8. The apparatus of claim 4, wherein said skirt is installed around said wafer heater.

9. The apparatus of claim 4, wherein said skirt is installed underneath said wafer heater.

10. The apparatus of claim 1, further comprising:
    a pumping plate channel ring having an upper surface and a lower surface and a plurality of through holes extending from said upper surface to said lower surface.

11. The apparatus of claim 10, wherein said pumping plate channel ring has uniform through holes.

12. The apparatus of claim 10, wherein said pumping plate channel ring has non-uniform through holes.

13. The apparatus of claim 12 further comprising:
    a third pumping channel defined by said outer wall of said pumping plate, said upper surface of said ledge, said inner wall of said processing chamber and said lower surface of said pumping plate channel ring.

* * * * *